(12) United States Patent
Krishnakumar et al.

(10) Patent No.: US 12,165,686 B2
(45) Date of Patent: Dec. 10, 2024

(54) MEMORY POWER MANAGEMENT METHOD AND APPARATUS

(71) Applicant: Intel Corporation, Santa Clara, CA (US)

(72) Inventors: Nivedha Krishnakumar, San Diego, CA (US); Virendra Vikramsinh Adsure, Folsom, CA (US); Jaya Jeyaseelan, Campbell, CA (US); Nadav Bonen, Ofer Z (IL); Barnes Cooper, Hillsboro, OR (US); Toby Opferman, Portland, OR (US); Vijay Bahirji, Beaverton, OR (US); Chia-Hung Kuo, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 784 days.

(21) Appl. No.: 17/178,015

(22) Filed: Feb. 17, 2021

(65) Prior Publication Data
US 2022/0262427 A1 Aug. 18, 2022

(51) Int. Cl.
*G11C 11/406* (2006.01)
*G11C 5/14* (2006.01)
(Continued)

(52) U.S. Cl.
CPC .......... *G11C 11/40611* (2013.01); *G11C 5/14* (2013.01); *G11C 11/4023* (2013.01); *G11C 11/4074* (2013.01)

(58) Field of Classification Search
CPC .......... G11C 11/4023; G11C 11/40611; G11C 11/4074; G11C 5/14
See application file for complete search history.

(56) References Cited

U.S. PATENT DOCUMENTS

| | | | |
|---|---|---|---|
| 7,725,746 B2* | 5/2010 | Lee ................. | G06F 1/3246 |
| | | | 712/228 |
| 7,757,039 B2* | 7/2010 | Kaburlasos .......... | G11C 11/406 |
| | | | 711/202 |

(Continued)

FOREIGN PATENT DOCUMENTS

WO 2019/118096 A1 6/2019

OTHER PUBLICATIONS

European Search Report and Search Opinion, EP App. No. 22151094.4, Jun. 30, 2022, 8 pages.

*Primary Examiner* — Son L Mai
(74) *Attorney, Agent, or Firm* — NICHOLSON DE VOS WEBSTER & ELLIOTT LLP

(57) ABSTRACT

A mechanism where the locked pages are saved and restored by a hardware accelerator which is transparent to the OS. Prior to standby entry, the OS puts all DMA capable devices in the lowest-powered device low-power state after disabling bus mastering. The OS flushes all pageable memory to an NVM (in segments that are kept in self-refresh) and provides a list of pinned and locked pages in the DRAM to a power management controller (p-unit). The p-unit checks for all Bus Mastering DMA to be turned off and checks if a next OS timer wake event (TNTE) is greater than a threshold, to decide whether to enable or disable PASR or MPSM in Standby. If the conditions are met, the p-unit triggers a hardware accelerator to consolidate the pinned and locked pages in the DRAM to certain segment(s) of the DRAM during standby states, making it transparent to the OS.

19 Claims, 10 Drawing Sheets

(51) Int. Cl.
    *G11C 11/402*     (2006.01)
    *G11C 11/4074*     (2006.01)

(56) References Cited

U.S. PATENT DOCUMENTS

| | | | |
|---|---|---|---|
| 9,104,413 B2 * | 8/2015 | Lo ......................... | G06F 12/023 |
| 11,520,498 B2 * | 12/2022 | Bonen ................... | G06F 1/3225 |
| 2011/0296095 A1 * | 12/2011 | Su ......................... | G06F 1/3275 |
| | | | 711/E12.007 |

* cited by examiner

MEMORY POWER MANAGEMENT METHOD AND APPARATUS

BACKGROUND

Client platforms such as laptops, notebooks, and Chromebooks use either double data rate (DDR) or low power DDR (LPDDR) based Dynamic Random-Access Memory (DRAM) technology. Recent trends in client platforms show that memory is growing in bit density which in turns means higher capacity, for example, memory supported in laptops are ranging between 8 GB and 64 GB.

During standby states such as Windows Modern standby, Chrome Lucid Sleep and S3, currently, the lowest power mode the DRAM memory enters is self-refresh. Self-refresh means that the capacitance on the memory must be supplied with power periodically, such that the data is retained. This contributes to higher power consumption. The higher the memory capacity, the higher the self-refresh power. The impact of memory power is significant when the platform is in low power standby states when the other platform components like system-on-chip (SoC), devices, etc. consume very little power.

Currently, the memory power consumption (especially DDR memory) is high in Platform Standby states (about 20-40% of platform power). The higher power associated with keeping memory in self-refresh has significant impact on battery drain in laptops and has an impact on meeting energy regulations which are getting stringent in desktops.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
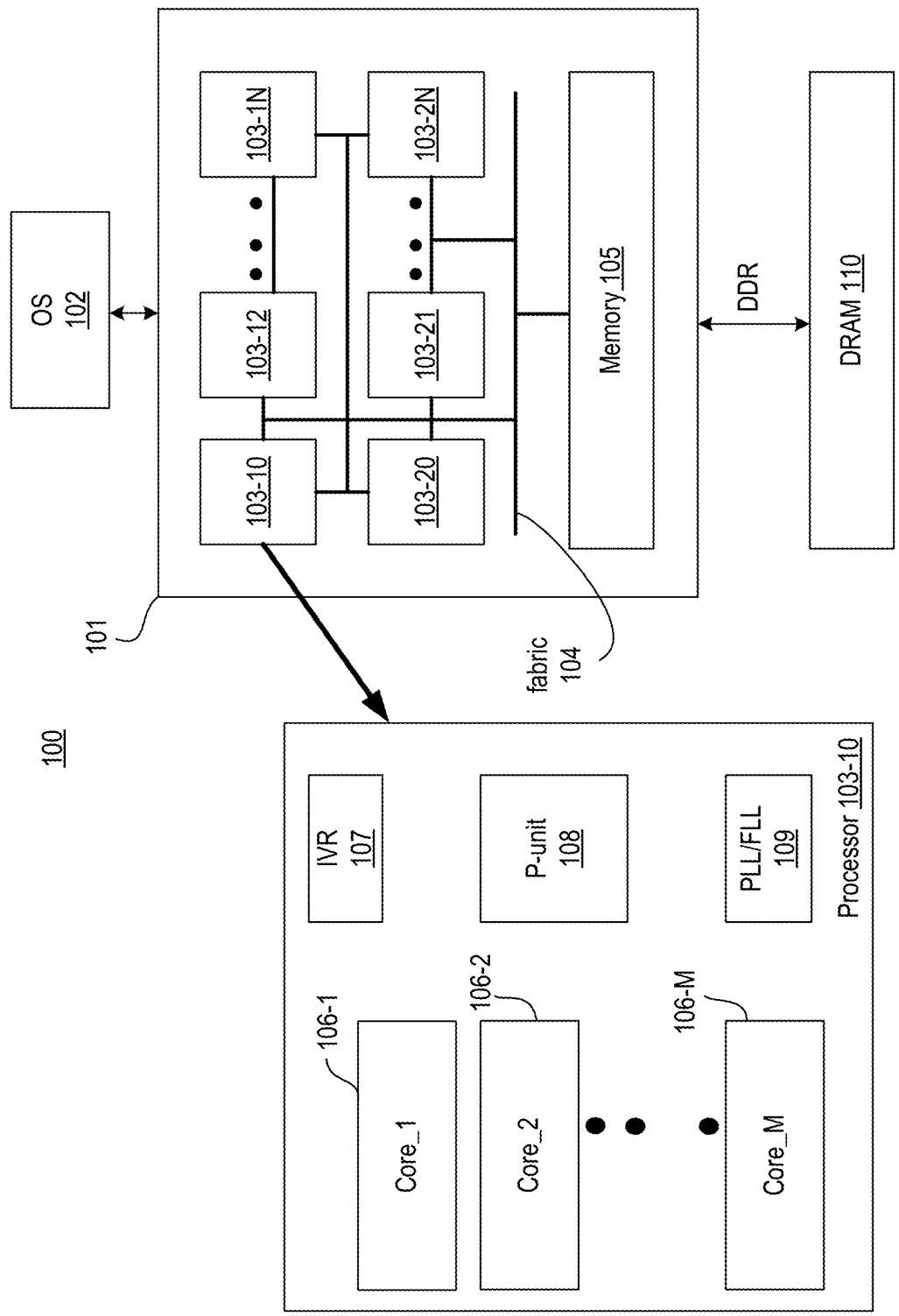
FIG. 1 illustrates a processor having hardware and/or software to perform memory power management, in accordance with some embodiments.

There are different kinds of pages hosted by an operating system (OS). Amongst them are locked pages which is used to always be physically present in the system's random accesses memory (RAM) and Pinned pages which is used to be always present in a specific address location of the RAM. Devices can request locked or pinned pages via direct memory access (DMA) and OS, and other software can also keep certain sections of their code in locked pages for performance purposes. When pages requested by an OS or software are not physically present in memory, the system causes page fault which impacts performance. When pages used by devices for DMA are not in memory, these can cause memory corruption, device errors and failures. These locked pages are scattered across the memory region.

During traditional suspend-to-RAM type of operation, the pinned and locked pages are retained in a dynamic random-access memory (DRAM) along with other data. Retaining the pages in the DRAM incurs power due to the DRAM self-refresh operation. During traditional suspend-to-disk operation, the entire contents of the DRAM are moved to a slower storage disk. The slower storage disk does not incur the DRAM self-refresh power but the system is slow to wake while all the contents of the DRAM are restored from the slower storage disk. To find a solution for both lower self-refresh power of the DRAM and lower system wake times, the pinned and locked pages in the DRAM can be moved to one segment of the memory which would be self-refreshed. If the amount of pinned and locked pages exceeds the size of memory segment, the pages can be compressed before storing them in the memory segment. Since the movement of the pinned and locked pages is from DRAM to DRAM the, system wake latency would see a significant improvement over suspend-to-disk.

Joint Electron Device Engineering Counsel (JEDEC) memory standard supports memory power management features such as Maximum Power Save mode (MPSM) and Partial array self-refresh (PASR), where self-refresh to portions of memory such as ranks, and banks can be turned off. However, the standard does not provide any suitable implementation of such features. Some embodiments describe a mechanism where the locked pages are saved and restored by a hardware accelerator which is transparent to the OS. In some embodiments, the devices are put in a lowest-powered device low power state (e.g., D3 state as defined by the Advanced Configuration and Power Interface Specification (ACPI)) and all bus mastering is turned off.

Here, D3 is the lowest-powered device low-power state. All devices are expected to support this state. Starting with Microsoft Windows 8, the operating system subdivides D3 into two separate and distinct sub-states, D3hot and D3cold. Earlier versions of Windows define the D3 state, but not the D3hot and D3cold sub-states. However, all versions of the PCI Bus Power Management Interface Specification define separate D3hot and D3cold sub-states, and versions 4 and later of the Advanced Configuration and Power Interface Specification ACPI define D3hot and D3cold sub-states. The use of D3hot and D3cold states are envisioned to be the lowest-powered device low power states for the purposes of various embodiments.

Here, "bus mastering" refers to a feature supported by many bus architectures that enables a device connected to the bus to initiate direct memory access transactions. Bus mastering is a bus design that allows an expansion card (or plug-in board) to access the computer's memory independently of a CPU. This allows data transfer between the peripheral and the main system memory while the CPU is being used by other devices. Bus mastering is also referred to as first-party DMA, in contrast with third-party DMA where a system DMA controller actually does the transfer.

Some embodiments provide a memory power management scheme where prior to standby entry, the OS puts all DMA capable devices in the lowest-powered device low-power state (e.g., D3 of ACPI) after disabling bus mastering. The OS flushes all pageable memory to storage or a RAM disk (in segments that are kept in self-refresh) and provides a list of pinned and locked pages in the DRAM to a power management controller (p-unit).

Here, the term "self-refresh" refers to an operation to maintain data in the volatile memory (e.g., a dynamic random-access memory (DRAM)). In the DRAM, each bit cell comprises at least one transistor coupled to a capacitor. Each bit of memory data is stored as the presence or absence of an electric charge on the capacitor. As time passes, the charges in the memory cells leak away, so without being refreshed the stored data would eventually be lost. To prevent this, a circuitry periodically reads each cell and rewrites it. As such, charge is restored on the capacitor to its original level. Each memory refresh cycle refreshes a succeeding area of memory cells, thus repeatedly refreshing all the cells in a consecutive cycle. This process is conducted automatically, hence "self-refresh" in the background by the memory circuitry and is transparent to the user. In some cases, while a refresh cycle is occurring the memory may not be available for normal read and write operations.

In some embodiments, the p-unit checks for all Bus Mastering DMA to be turned off and checks if a next OS timer wake event (TNTE) is greater than a programmed threshold, to decide whether to enable or disable PASR or MPSM in Standby. If the conditions are met, p-unit triggers a hardware accelerator to consolidate the pinned and locked pages in the DRAM to certain segments of the DRAM during standby states, making it transparent to OS. In some embodiments, the HW accelerator compresses and/or encodes the pages prior to saving them thereby reducing footprint. In some embodiments, data moved from memory to storage (e.g., non-volatile memory) is also compressed before it is saved in storage. Upon retrieval (e.g., when the system wakes up), the data is uncompressed. On successful migration, p-unit notifies a memory controller to turn off self-refresh to the appropriate memory segments, and puts the platform into Standby state.

In some embodiments, during standby exit, the p-unit on a wake event, powers up the memory controller, which turns on self-refresh for all memory segments. The p-unit then triggers the hardware accelerator which copies all the relocated pages back to the original location in memory. The platform thereafter exits the standby state.

In some embodiments, an apparatus (e.g., processor or system-on-chip (SoC)) is provided which comprises a power management unit; and a hardware accelerator coupled to the power management unit and to a memory, wherein, upon trigger of a standby entry, the power management unit triggers the hardware accelerator to consolidate pinned and locked pages in the memory to a segment of the memory that is self-refreshed. In some embodiments, the hardware accelerator compresses and/or encodes the pinned and locked pages prior to moving the pinned and locked pages to the segment of memory that is self-refreshed.

In some embodiments, the processor or apparatus comprises a memory controller to move data, upon trigger of the standby entry, from the memory to a non-volatile memory separate from the memory. In some embodiments, the memory controller compresses and/or encodes the data prior to the data being moved to the non-volatile memory. In some embodiments, the power management unit notifies the memory controller turns off self-refresh in segments of the memory from where the hardware accelerator consolidated the pinned and locked pages. In some embodiments, the memory controller disables self-refresh in segments of the memory from where the hardware accelerator consolidated the pinned and locked pages. In some embodiments, the segment of the memory that is self-refreshed includes a non-pageable page list. In some embodiments, the non-pageable page list includes a linked-list of source addresses of the pinned and locked pages prior to being consolidated, and destination addresses of pages being moved to the non-volatile memory. In some embodiments, the power management unit is communicatively coupled to an operating system, wherein the operating system is to turn off bus mastering after the memory controller moves the data, upon trigger of the standby entry, from the memory to the non-volatile memory separate from the memory.

In some embodiments, if direct memory access is off, the power management unit checks whether a time to next timer event is greater than a threshold prior to the hardware accelerator is to consolidate the pinned and locked pages in the memory to the segment of the memory that is self-refreshed. In some embodiments, the threshold indicates a time to store and/or restore pages moved from the memory to a non-volatile memory separate from the memory. In some embodiments, the power management unit initiates an exit sequence from standby. In some embodiments, the hardware accelerator restores the pinned and locked pages back to their original addresses in the memory during an exit sequence from standby. In some embodiments, the memory is a DRAM.

There are various technical effects of these embodiments. For example, the memory power management scheme is operating system agnostic. The scheme of various embodiments exhibits significant reduction in platform standby power. In platform S3 and Standby type states, the entire system-on-chip (SoC) power is approximately 5 mW and platform power is approximately 270 mW. Memory consumes significantly high power. For instance, 16 GB DDR5 in self-refresh consumes about 160 mW which is about 60% of the platform power consumption. Likewise 16 GB LPDDR5 in self-refresh consumes about 22 mW. The power savings by turning off the self-refresh power for 16 GB DDR5, keeping one segment in self-refresh, is about 60 mW savings. The power savings by turning off the self-refresh power for 16 GB LPDDR5, keeping one segment in self-refresh is about 8 mW savings. By using an accelerator, additional pages like DMA pinned pages and memory used by the Kernel can be moved, which enables more segments to be powered off. Having a hardware accelerator for doing memory compression/de-compression consumes lower power than using CPU cycles for software Compression/de-compression.

In some embodiments, by ensuring all devices are in RTD3 and bus mastering turned off, the scheme ensures that there shall be no memory requests in flight when the self-refresh is turned off. The scheme further ensures that the OS has stopped execution and issues MWAIT on all the threads, prior to memory movement by the hardware accelerator. Hence, the scheme guarantees that memory is not changing when copy is happening, so concerns regarding page collisions with OS-mapped memory/pre-populated pages during migration are taken care of because of the post OS operation. By copying all locked and pinned pages transparent to the OS (by the hardware accelerator), the solution described herein can be scaled to multiple OS and can leverage the PASR/MPSM power saving technology in DDR and LPDDR. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates processor system 100 having hardware and/or software to perform memory power management, in accordance with some embodiments. Processor system 100 comprises processor 101 coupled to operating system (OS) 102. Processor 101 comprises one or more processors 103 (individually labeled as processors 103_10 through 103_1N, and 103_20 through 103_2N, where 'N' is a number), fabric 104 connecting the processor 103, and memory 105. In some embodiments, each processor 103 is a die, dielet, or chiplet. Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor 103 may also be a dielet or chiplet. Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

In some embodiments, fabric 104 is a collection of interconnects or a single interconnect that allows the various dies to communicate with one another. Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

In some embodiments, each processor 103 may include a number of processor cores. One such example is illustrated with reference to processor 103_10. In this example, processor 103_10 includes a plurality of processor cores 106-1 through 106-M, where M is a number. For the sake of simplicity, a processor core is referred by the general label 106. Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core. Processor 103_10 may include an integrated voltage regulator (IVR) 107, power control unit (p-unit) 108, phase locked loop (PLL) and/or frequency locked loop (FLL) 109. The various blocks of processor 103_10 may be coupled via an interface or fabric. Here, the term "interconnect" refers to a communication link, or channel, between two or more points or nodes. It may comprise one or more separate conduction paths such as wires, vias, waveguides, passive components, and/or active components. It may also comprise a fabric. In some embodiments, p-unit 108 is coupled to OS 102 via an interface. Here the term "interface" generally refers to software and/or hardware used to communicate with an interconnect. An interface may include logic and I/O driver/receiver to send and receive data over the interconnect or one or more wires.

In some embodiments, each processor 103 is coupled to a power supply via voltage regulator. The voltage regulator may be internal to processor system 101 (e.g., on the package of processor system 101) or external to processor system 101. In some embodiments, each processor 103 includes IVR 107 that receives a primary regulated voltage from the voltage regulator of processor system 101 and generates an operating voltage for the agents of processor 103. The agents of processor 103 are the various components of processor 103 including cores 106, IVR 107, p-unit 108, PLL/FLL 109.

Accordingly, an implementation of IVR 107 may allow for fine-grained control of voltage and thus power and performance of each individual core 106. As such, each core 106 can operate at an independent voltage and frequency, enabling great flexibility and affording wide opportunities for balancing power consumption with performance. In some embodiments, the use of multiple IVRs enables the grouping of components into separate power planes, such that power is regulated and supplied by the IVR to only those components in the group. For example, each core 106 may include an IVR to manage power supply to that core where that IVR receives input power supply from the regulated output of IVR 107 or voltage regulator of processor system 101. During power management, a given power domain of one IVR may be powered down or off when the processor core 106 is placed into a certain low power state, while another power domain of another IVR remains active, or fully powered. As such, an IVR may control a certain domain of a logic or processor core 106. Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to as an Autonomous Perimeter (AP). A domain can be an entire system-on-chip (SoC) or part of the SoC, and is governed by a p-unit.

In some embodiments, each processor 103 includes its own p-unit 108. P-unit 108 controls the power and/or performance of processor 103. P-unit 108 may control power and/or performance (e.g., IPC, frequency) of each individual core 106. In various embodiments, p-unit 108 of each processor 103 is coupled via fabric 104. As such, the p-units 108 of each processor 103 communicate with another and OS 102 to determine the optimal power state of processor system 101 by controlling power states of individual cores 106 under their domain.

P-unit 108 may include circuitry including hardware, software and/or firmware to perform power management operations with regard to processor 103. In some embodiments, p-unit 108 provides control information to voltage regulator of processor system 101 via an interface to cause the voltage regulator to generate the appropriate regulated voltage. In some embodiments, p-unit 108 provides control information to IVRs of cores 106 via another interface to control the operating voltage generated (or to cause a corresponding IVR to be disabled in a low power mode). In some embodiments, p-unit 108 may include a variety of power management logic units to perform hardware-based power management. Such power management may be wholly processor controlled (e.g., by various processor hardware, and which may be triggered by workload and/or power, thermal or other processor constraints) and/or the power management may be performed responsive to external sources (such as a platform or power management source or system software). In some embodiments, p-unit 108 is implemented as a microcontroller. The microcontroller can be an embedded microcontroller which is a dedicated controller or as a general-purpose controller. In some embodiments, p-unit 108 is implemented as a control logic configured to execute its own dedicated power management code, here referred to as pCode. In some embodiments, power management operations to be performed by p-unit 108 may be implemented externally to a processor 103, such as by way of a separate power management integrated circuit (PMIC) or other component external to processor system 101. In yet other embodiments, power management operations to be performed by p-unit 108 may be implemented within BIOS or other system software. In some embodiments, p-unit 108 of a processor 103 may assume a role of a supervisor or supervisee.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit In various embodiments, p-unit 108 executes a firmware (referred to as pCode) that communicates with OS 102. In various embodiments, each processor 103 includes a PLL or FLL 109 that generates clock from p-unit 108 and input clock (or reference clock) for each core 106. Cores 106 may include or be associated with independent clock generation circuitry such as one or more PLLs to control operating frequency of each core 106 independently.

In some embodiments, processor system 100 includes a hardware accelerator that performs a mechanism where locked pages are saved and restored by the hardware accelerator which is transparent to OS 102. In some embodiments, the devices (e.g., processor cores 103) are put in a lowest-powered device low power state (e.g., D3 state as defined by the Advanced Configuration and Power Interface Specification (ACPI)) and all bus mastering is turned off.

Some embodiments provide a memory power management scheme where prior to standby entry, OS 102 puts all DMA capable devices in the lowest-powered device low-power state (e.g., D3 of ACPI) after disabling bus mastering. OS 102 flushes all pageable memory to storage or a RAM disk (in segments that are kept in self-refresh) and provides a list of pinned and locked pages in DRAM 110 to a power management controller (p-unit), such as p-unit 108 at a core-level or a supervisor p-unit. In some embodiments, p-unit 108 checks for all Bus Mastering DMA to be turned off and checks if a next OS timer wake event (TNTE) is greater than a programmed threshold, to decide whether to enable or disable PASR or MPSM in Standby. If the conditions are met, p-unit triggers a hardware accelerator to consolidate the pinned and locked pages in DRAM 110 to certain segments of DRAM 110 during standby states, making it transparent to OS 102. If there is enough space in segment-1 of DRAM, some of the pageable pages can also be stored there to improve responsiveness of applications while exiting low power states, in accordance with some embodiments. In some embodiments, the HW accelerator compresses and/or encodes the pages prior to saving them thereby reducing footprint. In some embodiments, data moved from memory to storage (e.g., non-volatile memory) is also compressed before it is saved in storage. Upon retrieval (e.g., when the system wakes up), the data is uncompressed. On successful migration, p-unit 108 notifies a memory controller to turn off self-refresh to the appropriate memory segments, and puts the platform into Standby state.

In some embodiments, during standby exit, p-unit 108 on a wake event, powers up the memory controller, which turns on self-refresh for all memory segments of DRAM 110. P-unit 108 then triggers the hardware accelerator which copies all the relocated pages back to the original location in memory. The platform thereafter exits the standby state.

Figure 2:
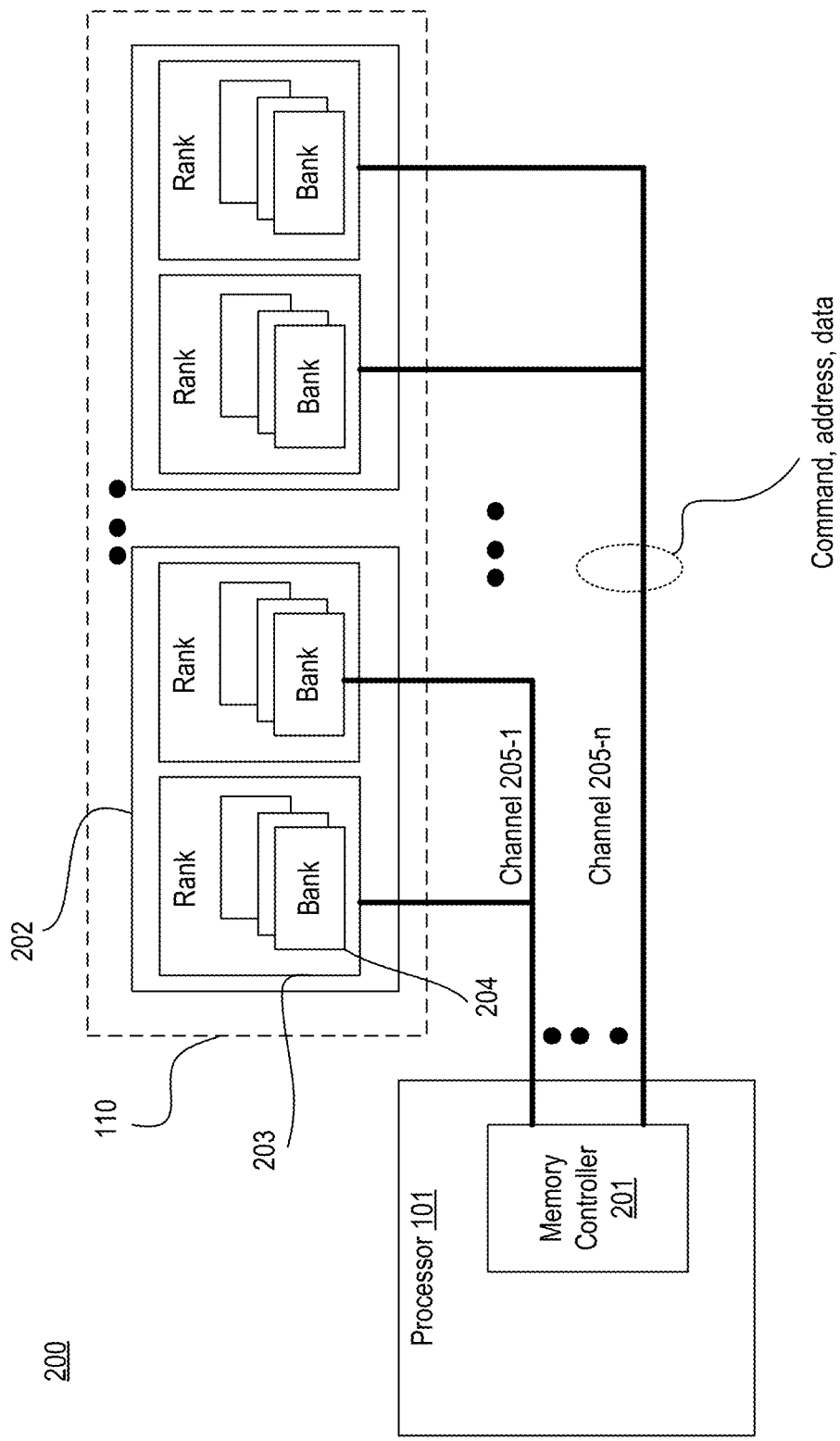
FIG. 2 illustrates a high-level memory architecture with apparatus for memory power management, in accordance with some embodiments.

FIG. 2 illustrates a high-level memory architecture 200 with apparatus for memory power management, in accordance with some embodiments. Architecture 200 comprises memory controller 201, which can be part of processor 101 or outside of processor 101. Architecture 200 further comprises memory 110 which is partitioned into modules 202. Each module 202 may include a rank 203. Each rank may include memories organized as banks 204. The interface between memory controller 201 and the ranks 203 is via any suitable memory interface such as double data rate interface. Channels 205-1 through 205-n carry command, address, and data signals to/from the memory 110 to memory controller 201. When memory 110 is a DRAM accessible by DDR interface, the memory is organized into rows and columns. These rows and columns are grouped together to form a bank 204. Groups of banks 204 form rank 203.

There are two JEDEC standard features to save DRAM power when the memory is in self refresh—partial array self-refresh (PASR) and maximum power saving mode (MPSM). PASR allows suspension of the self-refresh operation on selected banks or segments in DRAM 110 thus saving power. PASR is available in an LPDDR DRAMs and in DDR5 DRAMs, for example. MPSM feature is like the PASR feature but operates on a per device granularity to save power.

When using either the PASR or MPSM feature by turning off the self-refresh operation in DRAMs, there will be a loss of data in the segments or banks that are not being refreshed. This requires either moving the pages from the DRAM to a non-volatile storage (NVM) or consolidate in a section of the DRAM that will be refreshed. One goal is to put merely the critical number of pages in the refreshed section of the DRAM that would be used for fast system exit from the idle state while still saving power.

Figure 3:
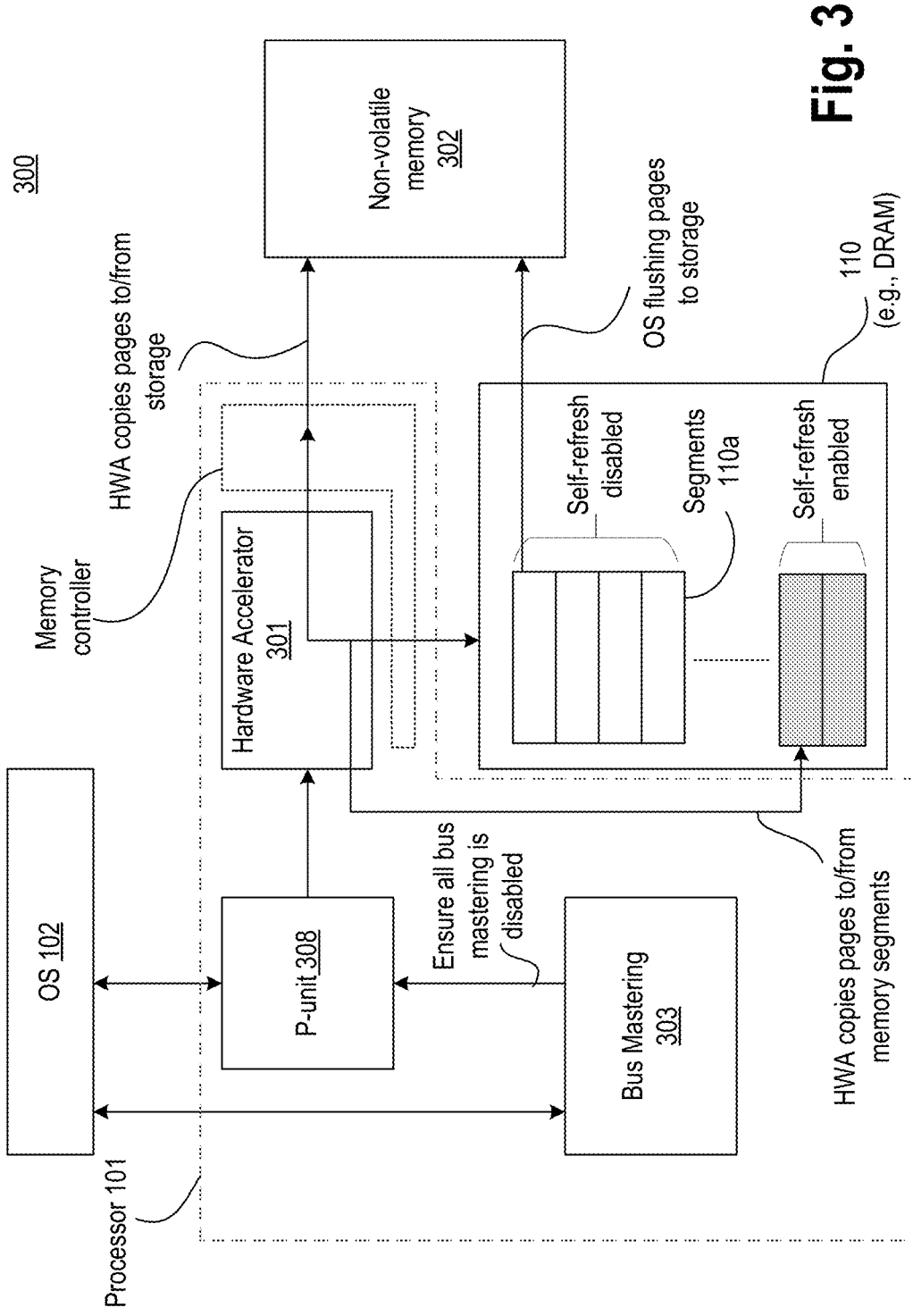
FIG. 3 illustrates an architecture for memory management using hardware accelerator transparent to an operating system, in accordance with some embodiments.

FIG. 3 illustrates architecture 300 for memory management using hardware accelerator transparent to an operating system, in accordance with some embodiments. Architecture 300 illustrates relevant components of processor system 100. In various embodiments, processor 101 comprises hardware accelerator (HWA) 301, bus mastering logic 303, and p-unit 308 (e.g., supervisor p-unit 108). OS 102 is communicatively coupled to processor 101 (e.g., to p-unit 308 and bus mastering logic 303). As discussed with reference to FIG. 3, memory 110 (e.g., DRAM) comprises a plurality of segments 110a. While memory 110 is illustrated as directly coupled to hardware accelerator 301, a person skilled in the art would appreciate that some embodiments use a memory controller as the primary interface between processor 101 logics and memory 110. In some embodiments, hardware accelerator 301 is communicatively coupled to the memory controller, which in turn is coupled to memory 110 via a memory channel such as a DDR compliant channel. In various embodiments, processor 101 is coupled to a storage device 302 such as a non-volatile memory (NVM). NVM 302 can be any suitable NVM. For example, NVM 302 is one or more of: magnetic random-access memory (MRAM), ferroelectric RAM (FeRAM), flash memory (e.g., NAND or NOR memory), resistive RAM (Re RAM), phase change memory (PCM), three-dimensional cross-point (3D-X point). In some embodiments, all components shown in architecture 300 are part of a system-on-chip (SoC).

In some embodiments, hardware accelerator 301 performs a mechanism where locked pages are saved and restored by hardware accelerator 301 which is transparent to OS 102. In some embodiments, the devices (e.g., processor cores 103, and other components coupled to processor system 100) are put in a lowest-powered device low power state (e.g., D3 state as defined by the Advanced Configuration and Power Interface Specification (ACPI)) and all bus mastering is turned off. For example, p-unit 308 ensures all bus mastering is disabled by bus mastering logic 303.

Prior to standby entry, OS 102 puts all DMA capable devices in the lowest-powered device low-power state (e.g., D3 of ACPI) after disabling bus mastering feature of logic 303. OS 102 flushes all pageable memory from segments 110a to NVM 302 and provides a list of pinned and locked pages in DRAM 110 to p-unit 308 at a core-level. In some embodiments, p-unit 308 checks for all Bus Mastering DMA to be turned off and checks if a next OS timer wake event (TNTE) is greater than a programmed threshold, to decide whether to enable or disable PASR or MPSM in Standby. If the conditions are met, p-unit 308 triggers hardware accelerator 301 to consolidate the pinned and locked pages in DRAM 110 to certain segments of DRAM 110 (e.g., segment with self-refresh enabled) during standby states, making it transparent to OS 102. In some embodiments, hardware accelerator 301 compresses and/or encodes the pages from segments 110a prior to saving them in NVM 302 thereby reducing footprint. On successful migration, p-unit 308 notifies a memory controller to turn off self-refresh to the appropriate memory segments 110a, and puts the platform into Standby state.

In some embodiments, during standby exit, p-unit 308 on a wake event, powers up the memory controller, which turns on self-refresh for all memory segments 110a of DRAM 110. P-unit 308 then triggers hardware accelerator 301 which copies all the relocated pages from NVM 302 back to the original location in memory 110. The platform thereafter exits the standby state.

Figure 4:
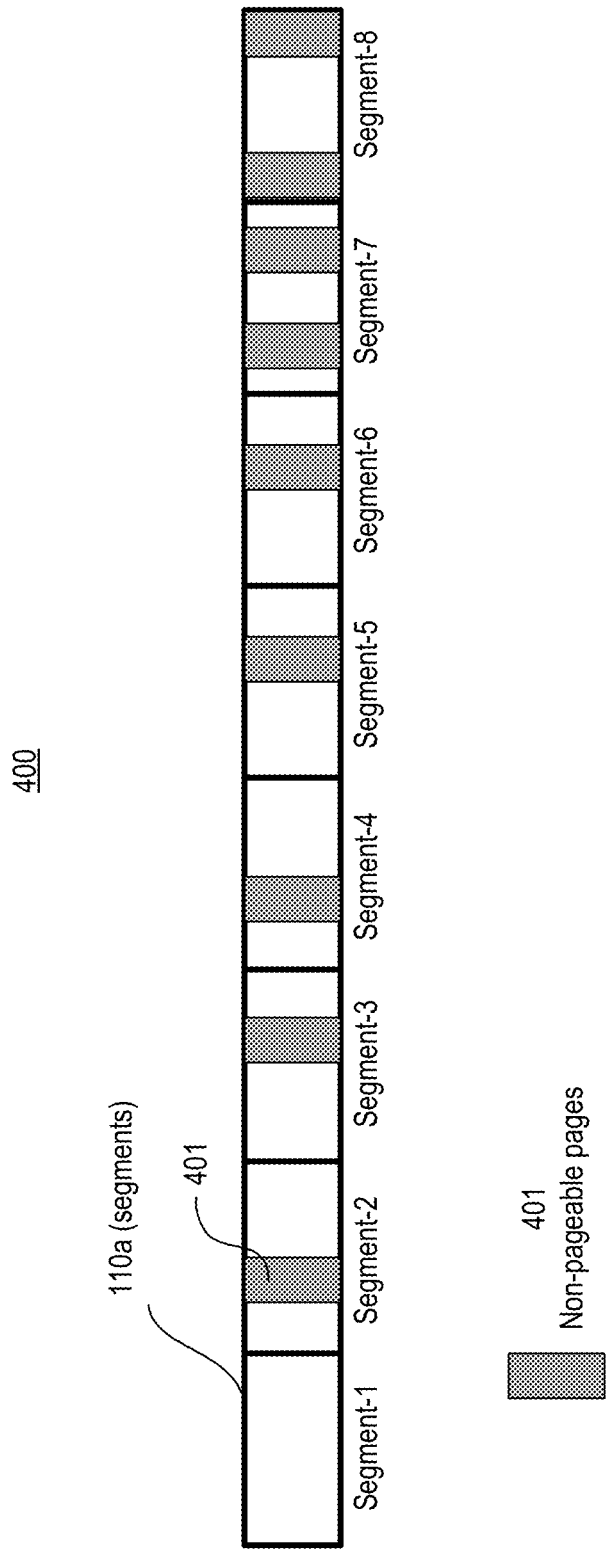
FIG. 4 illustrates a memory with segments and non-pageable pages.

FIG. 4 illustrates memory 400 with segments 110a and scattered non-pageable pages 401. In this example, memory 400 is divided into eight segments 110a—Segment-1, Segment-2, Segment-3, Segment-4, Segment-5, Segment-6, Segment-7, and Segment-8. Memory 400 can be divided into fewer or more segments than eight segments. In some embodiments, the segments 110a can be of same size or varying sizes. In one example, for a 16 GB DDR5 memory with 8 segments, each segment has a size of 2 GB.

In some embodiments, each segment 110a or at least some segments include non-pageable pages 401. Here, non-pageable pages refer to the pages that cannot be paged out from DDR DRAM. These pages 401 include locked pages, pinned pages (e.g., in Linux operating system), non-pageable pages, driver locked pages (e.g., in Windows operating system), and/or other user/application pages that are needed for performance. These pages could be scattered across memory (e.g., in Windows operating system) or grouped together in a specific zone (e.g., zone_normal, zone_moveable in Linux operating system). Migrating these pages 401 is the first step in enabling PASR.

Figure 5:
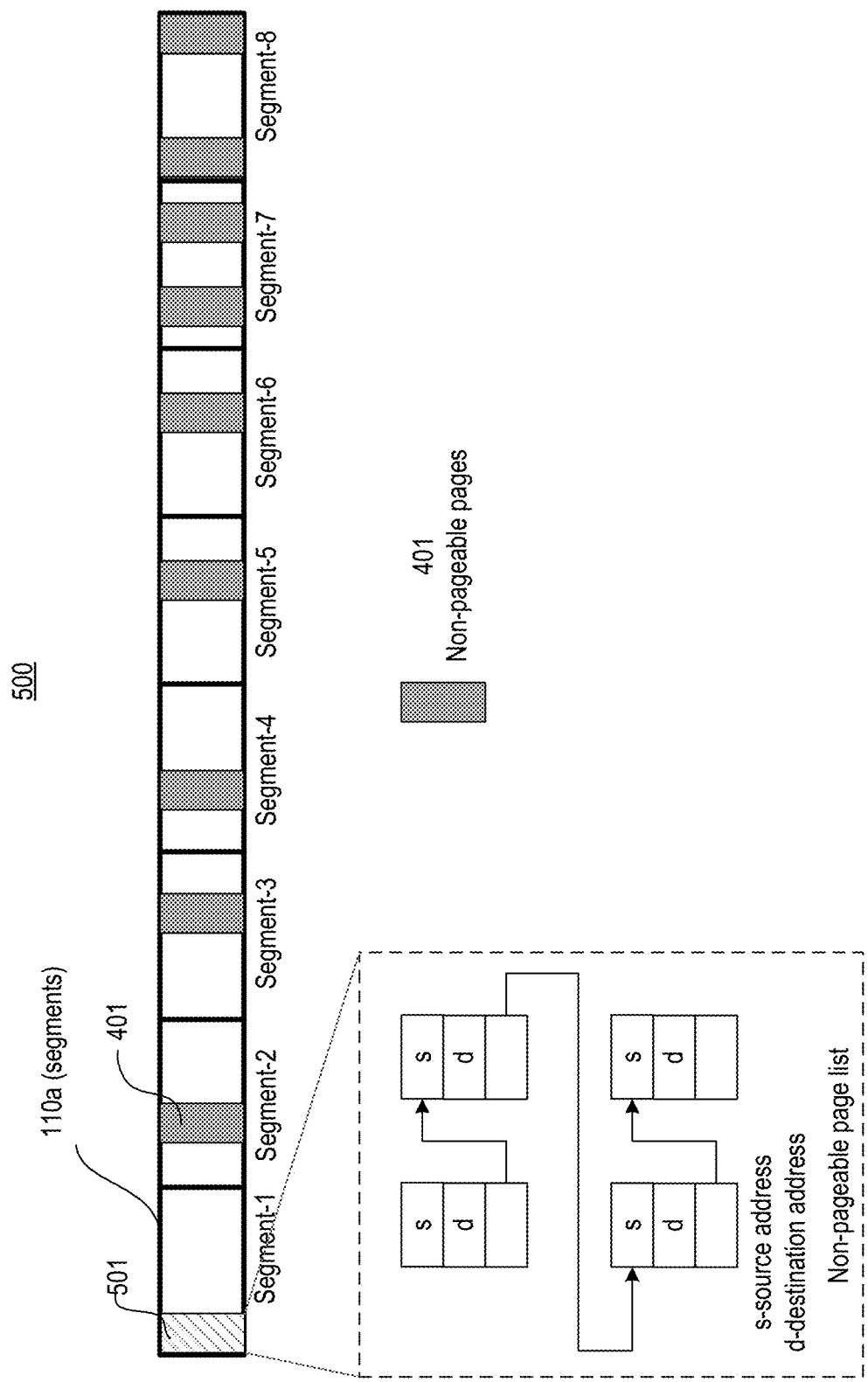
FIG. 5 illustrates a memory with segments and non-pageable pages, where one segment holds a non-pageable page list.

FIG. 5 illustrates memory 500 with segments 110a and non-pageable pages 401, where one segment holds a non-pageable page list. Memory 500 is another snapshot of memory 400 where one of the segments (here, Segment-1 which is a self-refresh (SR) segment) holds the non-pageable page list. To enable migration of memory contents to NVM 302, a list is maintained by OS 102. This list is the non-pageable page list 501 which includes a source address of non-pageable pages 401 and the destination address to where the pages are to be copied. In some embodiments, an OS kernel memory manager (e.g., part of OS 102) computes the destination address by looking up the free pages or space in the self-refresh refresh segment (here, Segment-1). Here, non-pageable page list 501 is maintained as a linked-list comprising sections linked together, where each section of the linked-list includes source (s) and destination (d) addresses and a pointer to the next section of the linked list.

Figure 6:
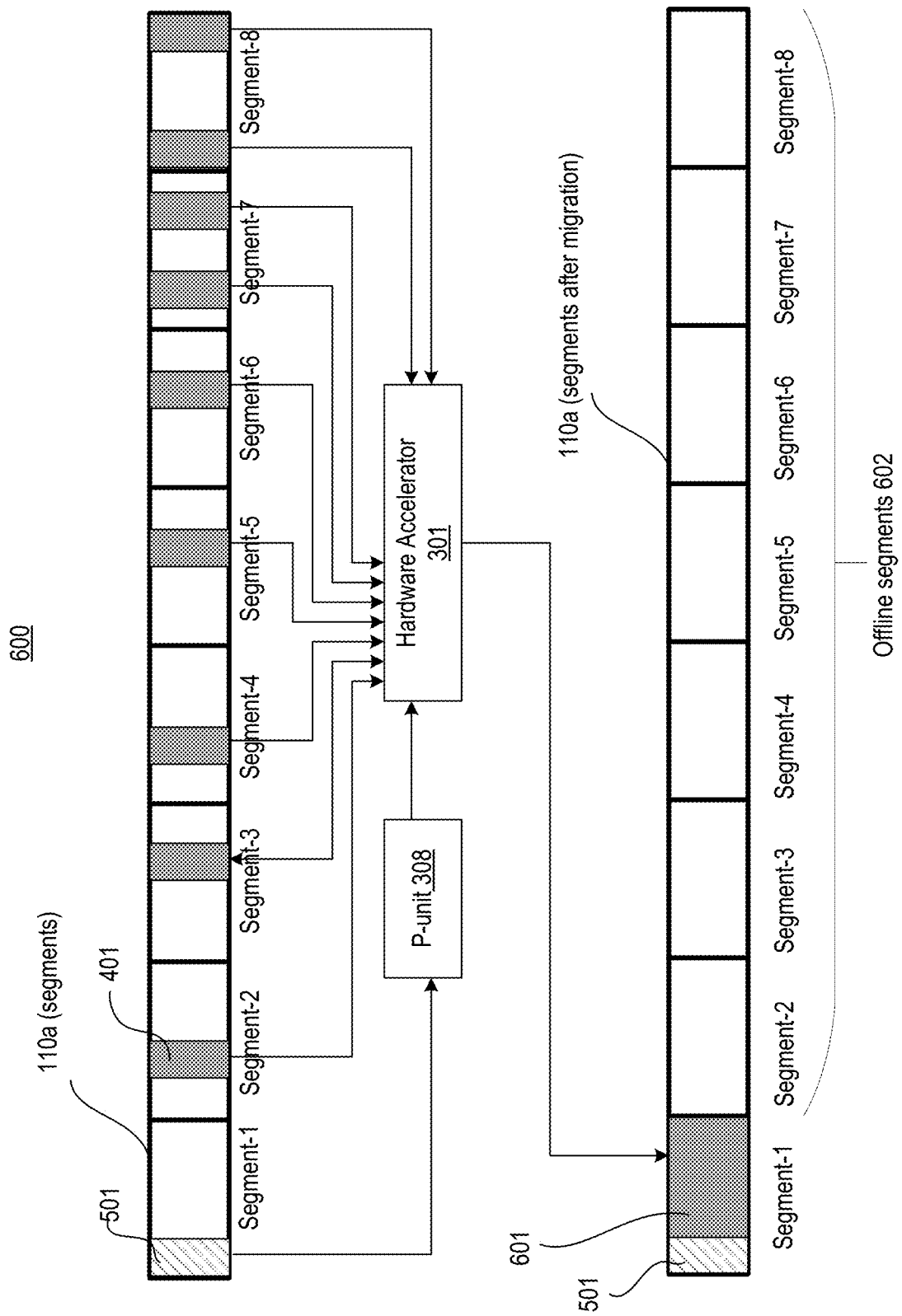
FIG. 6 illustrates a memory map when the hardware accelerator completes the migration of all the non-pageable pages to self-refresh segment, in accordance with some embodiments.

FIG. 6 illustrates memory map 600 when hardware accelerator 301 completes the migration of all non-pageable pages 401 to self-refresh segment (e.g., Segment-1), in accordance with some embodiments. In some embodiments, hardware accelerator 301 moves non-pageable pages 401 from and to segments 110a of the DDR DRAM memory 110 that is not kept in self-refresh in platform standby state. In some embodiments, p-unit 308 submits non-pageable page list 501 to a work queue of hardware accelerator 301, which in turn begins the migration of pages 401. Upon completing the migration of pages 401 by hardware accelerator 301, the non-pageable pages 401 are grouped together as pages 601 in self-refresh portion of segments 110a. Here, the self-refresh segment is Segment-1 which includes non-pageable page list 501 and all the non-pageable pages 401 together as pages 601. Any data in the other segment is stored in NVM 302, in accordance with some embodiments. Once page migration is complete, hardware accelerator 301 hints p-unit 308 to communicate to memory controller to put the required memory segment (here, Segment-1) in self-refresh while other segments (e.g., Segment-2 through Segment-8) are in non-self-refresh (e.g., off-line segments 602).

There are several technical effects of having hardware accelerator 301 based migration of non-pageable pages. For example, hardware accelerator 301 makes the operation transparent to OS 102 which allows the scheme of various embodiments to be leveraged across several operating systems (because the scheme is agnostic to the type of OS). When moving non-pageable pages 401, OS 102 needs to be in quiescent state to avoid any collisions. Using hardware accelerator 301 controlled by p-Code of p-unit 308 rather than processor cores 106 avoids this collision issue, in accordance with some embodiments. Hardware accelerators like data streaming accelerators have high bandwidth, around 30 GB/s, making it an ideal choice over existing DMA engines which have very low bandwidth in a few 10s to 100s of MB/s. This gives hardware accelerator 301 an edge over other solutions for bringing the processor system in and out of PASR in a time short enough to meet the modern standby exit requirements. The scheme reduces the overhead and removes enabling complexity in OS 102 to migrate pages for memory power management.

The time taken to migrate pages 401 depend on the three factors: frequency at which hardware accelerator 301 operates, size of pages, and number of pages. Standby with PASR can be viewed as having the benefits of both the suspend to RAM state (e.g., S3 state) and suspend to disk state (e.g., S4 state). PASR provides the benefit of higher power savings compared to S3 state and better wake latency compared to S4 state.

An average user has around 4 GB of data to be moved, before standby, out of which 100 MB are non-pageable pages, assuming a user has a 16 GB DDR5 DRAM memory with NVM 302 as storage with 4 GB/s for Read/Write. Table 1 shows a comparison of latency and power savings across different standby states.

TABLE 1

| Power States | Suspend to Disk | Suspend with 1 memory segment in self-refresh, 3.9 GB moved to NVM 302 | Suspend with 1 segment in self-refresh and 3.9 GB compressed and moved to DDR DRAM 110 | Suspend to DRAM 110 |
| --- | --- | --- | --- | --- |
| Latency in moving pages | 1 sec (data * storage latency) | 978 ms (3 ms for 100 MB + 3.9 GB/4 GB/s) | 8-10 ms | 0 |
| DDR Power | 0 | 80 mW | 80 mW | 160 mW |

Column 3 in Table 1 shows a scenario where 3.9 GB of data is migrated from DDR DRAM 110 to NVM 302 and 100 MB of non-pageable pages 401 are moved to self-refresh segment, Segment-1. Column 4 in Table 1 shows the scenario where 3.9 GB of pages can be compressed and saved in the self-refresh segment of memory 110 and 100 MB non-pageable pages 401 are moved into the self-refresh memory segment. Table 1 shows standby entry where PASR leverages the best of both worlds (e.g., S3 and S4 states) in terms of power and latency.

Figure 7:
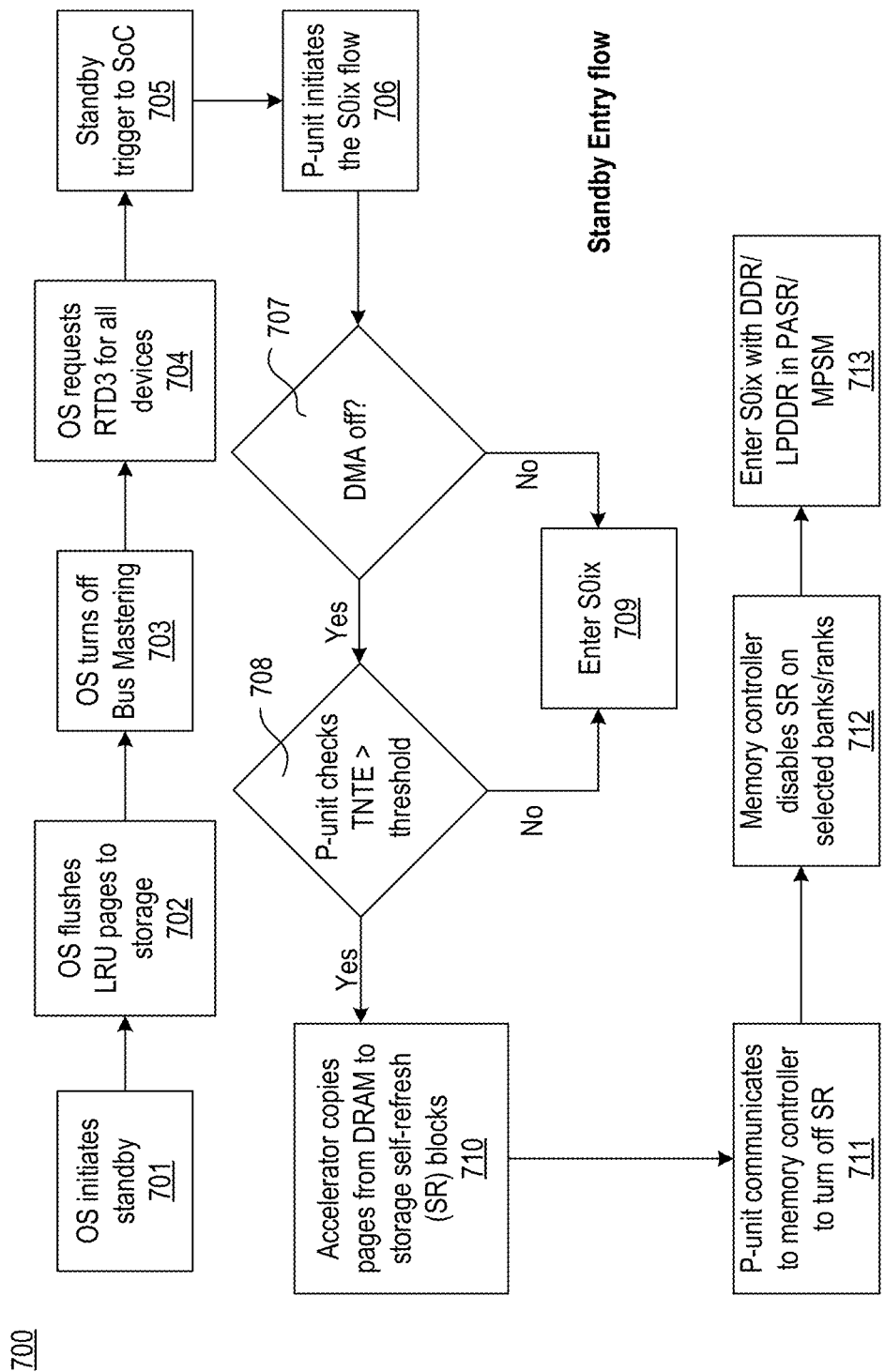
FIG. 7 illustrates a flowchart for standby entry, in accordance with some embodiments.

FIG. 7 illustrates flowchart 700 for standby entry, in accordance with some embodiments. While various blocks are shown in a particular order, some blocks can be performed before others or simultaneously. The operations of each block can be performed by hardware, software, or a combination of them.

At block 701, OS 102 initiates standby (i.e., low power state). Standby state can be initiated by user action such as closing laptop lid, pressing power button, entering sleep state after expiration of an idle timer, or after getting a hint from OS. At block 702, OS 102 flushes least recently used (LRU) pages into NVM 302. At block 703, OS 102 turns off bus mastering to ensure there is no direct memory accesses (DMAs) from devices (e.g., memory modules, memories connected by any interface such as peripheral component interconnect (PCI) express (PCIe), DDR, LPDDR, SATA, etc.). At block 704, OS 102 requests all the devices attached to processor system 100 or processor 101 to enter a low power state such as a D3 state defined by the ACPI. In one example, all PCI devices coupled to processor 101 are put in PCI-Express Runtime D3 (RTD3) state. At block 705, OS 102 then sends standby trigger to p-unit 308 (e.g., supervisor p-unit) of SoC 101.

At block 706, p-unit 308 initiates SoC 101 to enter an idle standby power state. One such standby power state is S0ix power state. S0ix -state represents the residency in the Intel® SoC idle standby power state. The S0ix states shut off parts of SoC 101 when they are not in use, while still maintaining optimal performance. While the embodiments are described with reference to S0ix state, other similar idle standby power state may be used. After initiating SoC 101 to enter S0ix state, at block 707 p-unit 308 receives hint checks for DMA and checks whether DMA is off. If it is determined that DMA is not off, p-unit 308 allows SoC 101 to enter S0ix state as indicated by block 709. If DMA is off, the process proceeds to block 708.

Figure 10:
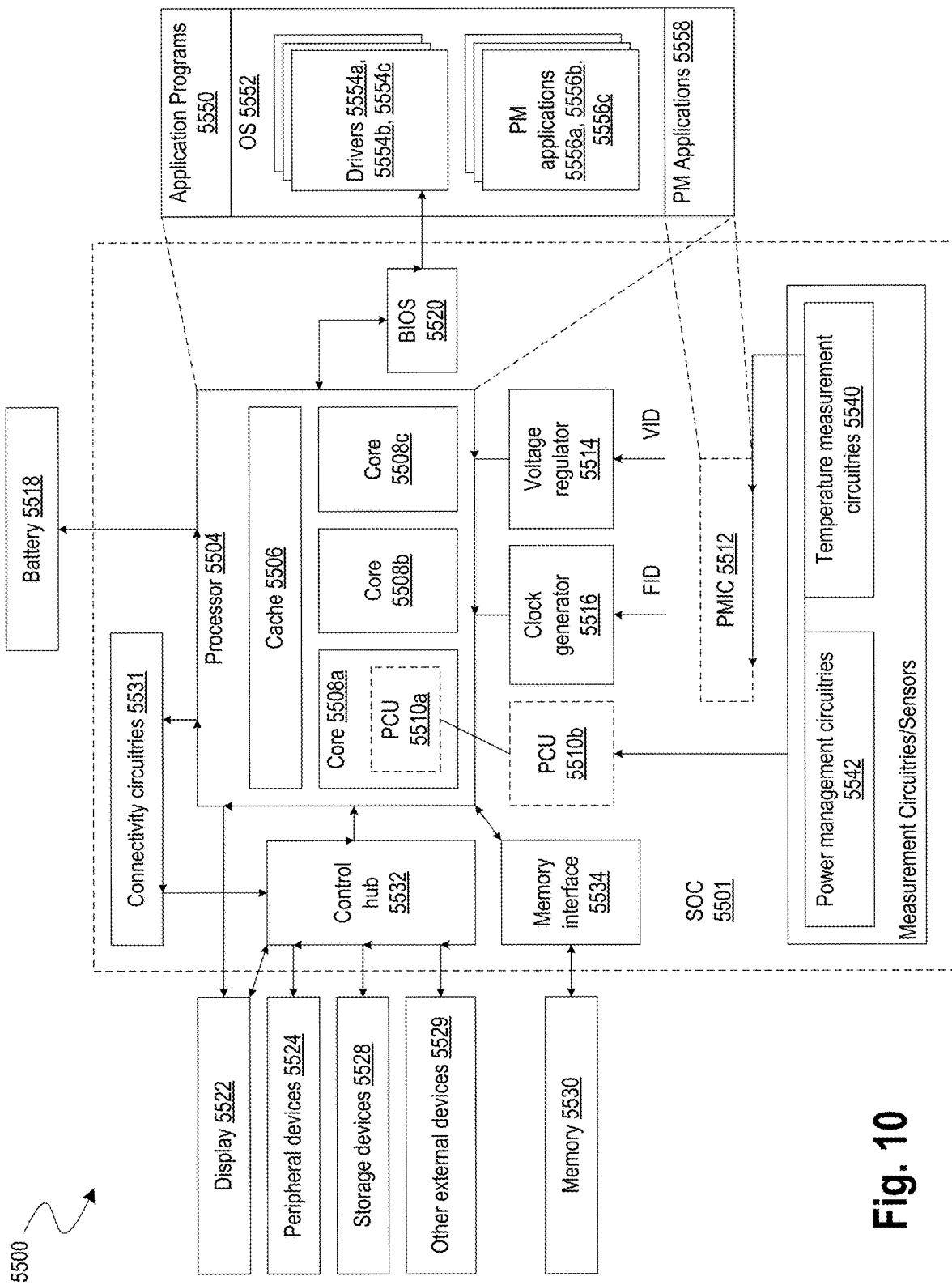
FIG. 10 illustrates a smart device or a computer system or an SoC (System-on-Chip) with apparatus and/or mechanism for memory power management, in accordance with some embodiments.

At block 708, p-unit 308 checks for the Time to Next Timer Event (TNTE) in a TNTE register which provides the time for next wake. If TNTE is greater than a threshold, the process proceeds to block 710. Otherwise, the process proceeds to block 709 where p-unit 308 puts SoC 101 into S0ix state. A more detailed example of SoC 101 is illustrated in FIG. 10. Referring back to FIG. 7. in some embodiments, the threshold is defined by a policy manager in p-code or a software driver. The threshold indicates sufficient time (e.g., in milliseconds) to store and/or restore the pages. In some embodiments, the threshold is predetermined. In some embodiments, the threshold is programmable (e.g., by software and/or hardware). The policy manager computes the amount of free space in the segment that is kept in self-refresh and the actual amount of non-pageable pages. If the number of non-pageable pages is less than the free space in the self-refresh segment/s, the policy manager will proceed with the PASR flow, else the policy manager will go to the conventional suspend-to-disk or suspend-to-RAM flow. The policy manager makes this decision based on the amount of energy that can be saved by invoking the PASR flow, in accordance with some embodiments.

In some embodiments, policy manager in a driver calculates a second threshold value to copy the pages from DRAM 110 to NVM 302 based on the amount of locked and pinned device pages. If the second threshold is much lesser than the (standby entry+time to next wake event), P-unit 308 requests hardware accelerator 301 to initiate the migration of locked and other pages into NVM 302 or into a self-refresh segment (e.g., Segment-1) by submitting the source and destination address of the pages to work queue of hardware accelerator 301. In various embodiments, the policy manager looks at various things like the size of the installed memory, the size of the installed battery, the percentage of charge remaining in the battery and the amount of energy that can be saved to make a decision on whether it should enter PASR.

At block 710, hardware accelerator 301 copies non-pageable pages 401 from segments 110a of DRAM 110 to self-refresh segment (e.g., Segment-1) of DRAM 110. As discussed herein, the self-refresh segment (e.g., Segment-1) of DRAM 110 also includes non-pageable page list 501, which is a link-list that has the source address of non-pageable pages and the destination address to where the pages must be copied. The process then proceeds to block 711.

At block 711, p-unit 308 communicates to memory controller to turn off self-refresh for all other segments (e.g., Segment-2 through Segment-8). For example, upon the completion of page migration by hardware accelerator 301, P-unit 308 communicates to the memory controller to disable self-refresh on DRAM 110 segments 602 or banks. As such, at block 712, the memory controller disables self-refresh on selected banks/ranks (e.g., segments 602). SoC 101 then enters standby. For example, SoC 101 enters S0ix with DDR/LPDDR DRAM 110 in PASR or MPSM as indicated by block 713.

Figure 8:
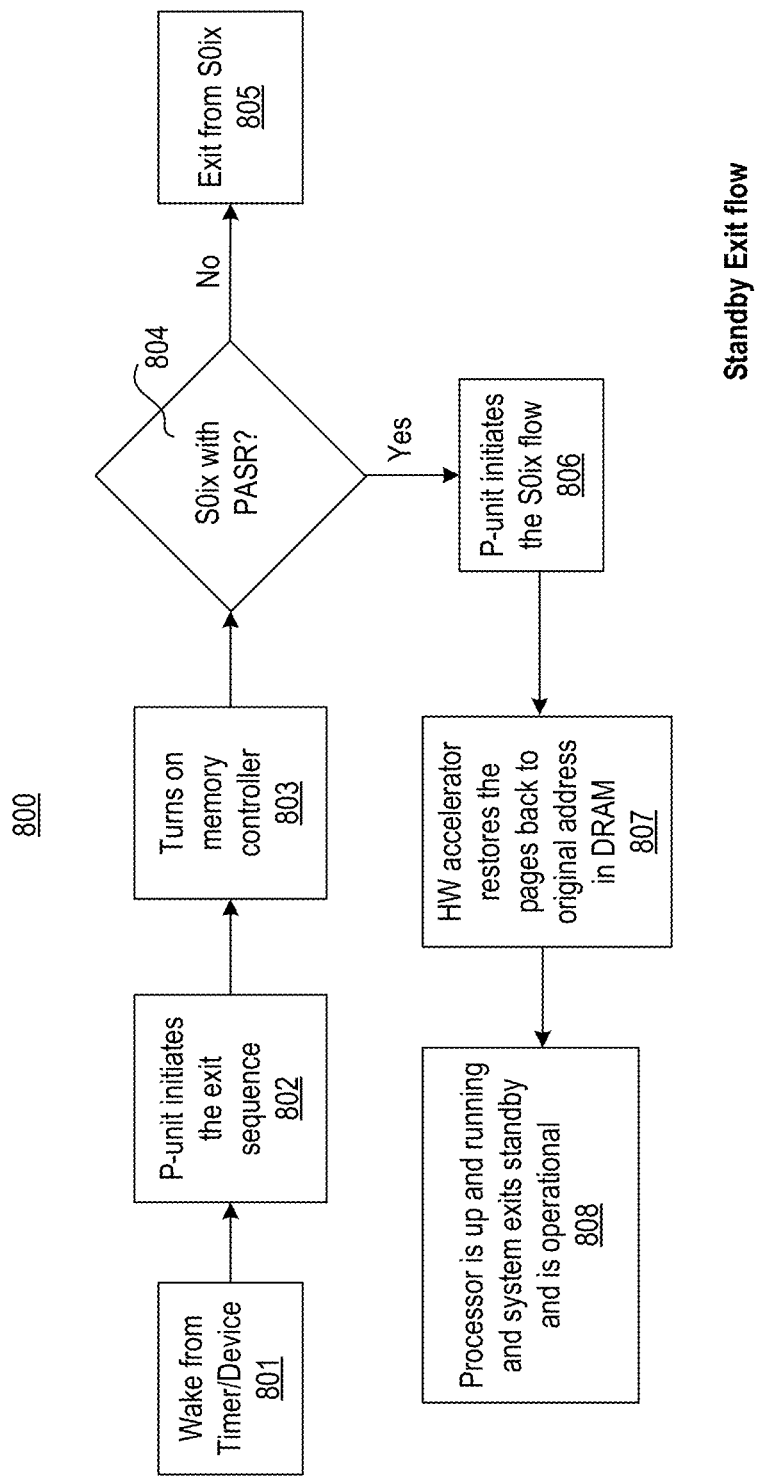
FIG. 8 illustrates a flowchart for standby exit, in accordance with some embodiments.

FIG. 8 illustrates flowchart 800 for standby exit, in accordance with some embodiments. While various blocks are shown in a particular order, some blocks can be performed before others or simultaneously. The operations of each block can be performed by hardware, software, or a combination of them.

At block 801, p-unit 308 and/or OS 102 detects a wake event from a standby state. For example, p-unit 308 and/or OS 102 detects a wake indication when a device indicates such, a timer expires, a user opens the lid of a laptop, a user clicks a mouse button or a key on a keyboard or there is a network event. At block 802, p-unit 308 initiates standby exit sequence. At block 803, p-unit 308 turns on the memory controller. At block 804, p-unit 308 checks if system 101 enters S0ix with PASR/MPSM mode. If p-unit 308 determines that system 101 enters S0ix with PASR/MPSM mode, then the process proceeds to block 806. At block 806, p-unit 308 requests the memory controller to bring memory out of PASR/MPSM. If p-unit 308 determines that system 101 does not enter S0ix with PASR/MPSM mode, the process proceeds to block 805. At block 805, p-unit 308 initiates the S0ix flow. Thereafter, at block 807, hardware accelerator 301 restores pages back to original address in DRAM 110. At block 808, p-unit 308 brings up processor system 101 to active state and exits standby state. For example, OS 102 resumes with devices in active state (e.g., D0) and DMA is turned on.

Figure 9:
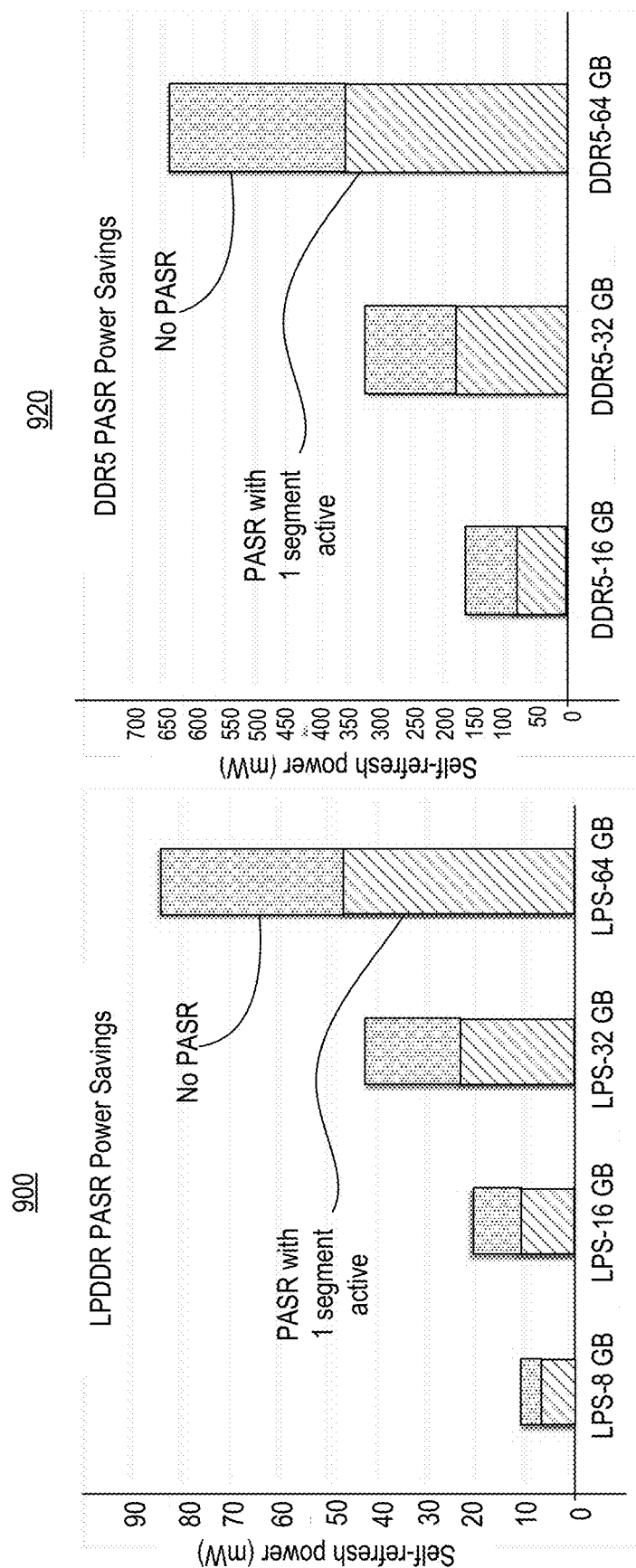
FIGS. 9A-B illustrate plots showing power savings from DDR and LPDDR using the memory power management apparatus and/or scheme, in accordance with some embodiments.

FIGS. 9A-B illustrate plots 900 and 920, respectively, showing power savings from DDR and LPDDR using the memory power management apparatus and/or scheme, in accordance with some embodiments. Data shows there is up to 50% reduction in power consumption in 64 GB DDR5 DRAM using the power management scheme of various embodiments. At higher memory capacity, more significant savings are expected. In one example, with hardware accelerator 301 running at 30 GB/s, it would take about 66 ms to restore 1 GB of non-pageable pages and get the system out of standby. The application and user data can be fetched in the background and depends on the amount of data that needs to be moved and bandwidth of the storage interface. Certain critical application data can also be moved to the self-refresh DRAM segment (e.g., Segment-1) to further optimize the PASR entry/exit timings. This can be controlled by system policy, in accordance with some embodiments. Wakes being a key component to battery life improvement factor, in one example the memory management scheme of various embodiments can achieve 60% improvement in battery life (considering 100 wakes on a platform) on a 40 WHr battery system and 60 Whr battery system.

FIG. 10 illustrates a smart device or a computer system or an SoC (System-on-Chip) with apparatus and/or mechanism for memory power management, in accordance with some embodiments. It is pointed out that those elements of FIG. 10 having the same reference numbers (or names) as the elements of any other figure may operate or function in any manner similar to that described, but are not limited to such. Any block in this smart device can have the apparatus for dynamically optimizing battery charging voltage.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 10, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 10, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware including an antenna) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510a/b and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, battery 5518 is a multi-battery system with workload dependent load-sharing mechanism. The mechanism is an energy management system that operates in three modes—energy saving mode, balancer mode, and turbo mode. The energy saving mode is a normal mode where the multiple batteries (collectively shown as battery 5518) provide power to their own set of loads with least resistive dissipation. In balancing mode, the batteries are connected through switches operating in active mode so that the current shared is inversely proportion to the corresponding battery state-of-charge. In turbo mode, both batteries are connected in parallel through switches (e.g., on-switches) to provide maximum power to a processor or load. In some embodiments, battery 5518 is a hybrid battery which comprising a fast charging battery and a high energy density battery. Fast charging battery (FC) means a battery capable of faster charging than high energy density battery (HE). FC may be today's Li-ion battery as it is capable of faster charging than HE. In some embodiments, a controller (part of battery 5518) optimizes the sequence and charging rate for the hybrid battery to maximize both the charging current and charging speed of the battery, while enabling longer battery life.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510*a*. In an example, some other sections of PCU 5510 may be implemented outside the processing cores 5508, and these sections of PCU 5510 are symbolically illustrated using a dotted box and labelled as PCU 5510*b*. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, battery 5518 includes hybrid technologies. For example, a mix of high energy density charge (e.g., Li-Ion batteries) carrying device(s) and low energy density charge carrying devices (e.g., supercapacitor) are used as batteries or storage devices. In some embodiments, a controller (e.g., hardware, software, or a combination of them) is used analyze peak power patterns and minimizes the impact to overall lifespan of high energy density charge carrying device-based battery cells while maximizing service time for peak power shaving feature. The controller may be part of battery 5518 or part of p-unit 5510*b*.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the $P_{soc,pk}$ SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level ($P_{soc,th}$) based on the available battery power (which changes slowly) and set the SoC throttling peak power ($P_{soc,th}$). In some embodiments, pCode decides the frequencies and voltages based on $P_{soc,th}$. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, a hardware and software coordinated processor power state policy (e.g., policy for C-state) is implemented that delivers optimal power state selection by taking in to account the performance and/or responsiveness needs of thread expected to be scheduled on the core entering idle, to achieve improved instructions per cycle (IPC) and performance for cores running user critical tasks. The scheme provides the ability to deliver responsiveness gains for important and/or user-critical threads running on a system-on-chip. P-unit 5510 which coupled to the plurality of processing cores, receives a hint from operating system 5552 indicative of a bias towards a power state or performance state for at least one of the processing cores of the plurality of processing cores based on a priority of a thread in context switch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/− 10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments are provided as examples. These examples can be combined with any other example to form distinct embodiments. For example, example 4 can be combined with example 7.

Example 1: An apparatus comprising: a power management unit; and a hardware accelerator coupled to the power management unit and to a memory, wherein, upon trigger of a standby entry, the power management unit triggers the hardware accelerator to consolidate pinned and locked pages in the memory to a segment of the memory that is self-refreshed.

Example 2: The apparatus of example 1, wherein the hardware accelerator compresses and/or encodes the pinned and locked pages prior to moving the pinned and locked pages to the segment of memory that is self-refreshed.

Example 3: The apparatus of example 1 comprises a memory controller to move data, upon trigger of the standby entry, from the memory to a non-volatile memory separate from the memory.

Example 4: The apparatus of example 3, wherein the memory controller compresses and/or encodes the data prior to the data being moved to the non-volatile memory.

Example 5: The apparatus of example 3, wherein the power management unit is to notify the memory controller to turn off self-refresh in segments of the memory from where the hardware accelerator consolidated the pinned and locked pages.

Example 6: The apparatus of example 3, wherein the memory controller disables self-refresh in segments of the memory from where the hardware accelerator consolidated the pinned and locked pages.

Example 7: The apparatus of example 3, wherein the segment of the memory that is self-refreshed includes a non-pageable page list.

Example 8: The apparatus of example 7, wherein the non-pageable page list includes a linked-list of source addresses of the pinned and locked pages prior to being consolidated, and destination addresses of pages being moved to the non-volatile memory.

Example 9: The apparatus of example 3, wherein the power management unit is communicatively coupled to an operating system, wherein the operating system is to turn off bus mastering after the memory controller moves the data, upon trigger of the standby entry, from the memory to the non-volatile memory separate from the memory.

Example 10: The apparatus of example 1, wherein if direct memory access is off, the power management unit checks whether a time to next timer event is greater than a threshold prior to the hardware accelerator is to consolidate the pinned and locked pages in the memory to the segment of the memory that is self-refreshed.

Example 11: The apparatus of example 10, wherein the threshold indicates a time to store and/or restore pages moved from the memory to a non-volatile memory separate from the memory.

Example 12: The apparatus of example 1, wherein the power management unit is to initiate an exit sequence from standby.

Example 13: The apparatus of example 1, wherein the hardware accelerator is to restore the pinned and locked pages back to their original addresses in the memory during an exit sequence from standby.

Example 14: The apparatus of example 1, wherein the memory is a DRAM.

Example 15: An apparatus comprising: a power management unit communicatively coupled to an operating system, wherein the operating system flushes least recently used pages to a non-volatile memory upon initiation of standby; and a hardware accelerator coupled to the power management unit and to a dynamic random-access memory (DRAM), wherein, upon initiation of the standby, the power management unit triggers the hardware accelerator to consolidate non-pageable pages in the DRAM to a segment of the DRAM that is self-refreshed.

Example 16: The apparatus of example 15, wherein the hardware accelerator compresses and/or encodes the non-pageable pages prior to moving the non-pageable pages to the segment of memory that is self-refreshed.

Example 17: The apparatus of example 15, wherein the hardware accelerator is to consolidate the non-pageable pages in the DRAM to the segment of the DRAM that is self-refreshed transparent to the operating system.

Example 18: A system comprising: a dynamic random-access memory (DRAM); a processor coupled to the DRAM; a non-volatile memory coupled to the processor, wherein the processor comprises: a power management unit; and a hardware accelerator coupled to the power management unit and to the DRAM, wherein, upon trigger of a standby entry, the power management unit triggers the hardware accelerator to consolidate pinned and locked pages in the DRAM to a segment of the DRAM that is self-refreshed.

Example 19: The system of example 18, wherein the hardware accelerator compresses and/or encodes the pinned and locked pages prior to moving the pinned and locked pages to the segment of the DRAM that is self-refreshed.

Example 20: The system of example 18, wherein the processor comprises a memory controller to flush data, upon trigger of the standby entry, from the DRAM to the non-volatile memory separate from the memory.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a power management unit; and
a hardware accelerator coupled to the power management unit and to a memory, wherein, upon trigger of a standby entry, the power management unit triggers the hardware accelerator to consolidate pinned and locked pages in the memory to a segment of the memory that is self-refreshed, and wherein the power management unit is to initiate an exit sequence from standby.

2. The apparatus of claim 1, wherein the hardware accelerator compresses and/or encodes the pinned and locked pages prior to moving the pinned and locked pages to the segment of memory that is self-refreshed.

3. The apparatus of claim 1 comprises a memory controller to move data, upon trigger of the standby entry, from the memory to a non-volatile memory separate from the memory.

4. The apparatus of claim 3, wherein the memory controller compresses and/or encodes the data prior to the data being moved to the non-volatile memory.

5. The apparatus of claim 3, wherein the power management unit is to notify the memory controller to turn off self-refresh in segments of the memory from where the hardware accelerator consolidated the pinned and locked pages.

6. The apparatus of claim 3, wherein the memory controller disables self-refresh in segments of the memory from where the hardware accelerator consolidated the pinned and locked pages.

7. The apparatus of claim 3, wherein the segment of the memory that is self-refreshed includes a non-pageable page list.

8. The apparatus of claim 7, wherein the non-pageable page list includes a linked-list of source addresses of the pinned and locked pages prior to being consolidated, and destination addresses of pages being moved to the non-volatile memory.

9. The apparatus of claim 3, wherein the power management unit is communicatively coupled to an operating system, wherein the operating system is to turn off bus mastering after the memory controller moves the data, upon trigger of the standby entry, from the memory to the non-volatile memory separate from the memory.

10. The apparatus of claim 1, wherein if direct memory access is off, the power management unit checks whether a time to next timer event is greater than a threshold prior to the hardware accelerator is to consolidate the pinned and locked pages in the memory to the segment of the memory that is self-refreshed.

11. The apparatus of claim 10, wherein the threshold indicates a time to store and/or restore pages moved from the memory to a non-volatile memory separate from the memory.

12. The apparatus of claim 1, wherein the hardware accelerator is to restore the pinned and locked pages back to their original addresses in the memory during an exit sequence from standby.

13. The apparatus of claim 1, wherein the memory comprises a DRAM.

14. An apparatus comprising:
a power management unit communicatively coupled to an operating system, wherein the operating system flushes least recently used pages to a non-volatile memory upon initiation of standby; and
a hardware accelerator coupled to the power management unit and to a dynamic random-access memory (DRAM), wherein, upon initiation of the standby, the power management unit triggers the hardware accelerator to consolidate non-pageable pages in the DRAM to a segment of the DRAM that is self-refreshed.

15. The apparatus of claim 14, wherein the hardware accelerator compresses and/or encodes the non-pageable pages prior to moving the non-pageable pages to the segment of memory that is self-refreshed.

16. The apparatus of claim 14, wherein the hardware accelerator is to consolidate the non-pageable pages in the DRAM to the segment of the DRAM that is self-refreshed transparent to the operating system.

17. A system comprising:
a dynamic random-access memory (DRAM);
a processor coupled to the DRAM;
a non-volatile memory coupled to the processor, wherein the processor comprises:
a power management unit; and a hardware accelerator coupled to the power management unit and to the DRAM, wherein, upon trigger of a standby entry, the power management unit triggers the hardware accelerator to consolidate pinned and locked pages in the DRAM to a segment of the DRAM that is self-refreshed, wherein the power management unit is to initiate an exit sequence from standby.

18. The system of claim 17, wherein the hardware accelerator compresses and/or encodes the pinned and locked pages prior to moving the pinned and locked pages to the segment of the DRAM that is self-refreshed.

19. The system of claim 17, wherein the processor comprises a memory controller to flush data, upon trigger of the standby entry, from the DRAM to the non-volatile memory separate from the memory.

* * * * *